US012757342B2

(12) United States Patent
Kim et al.

(10) Patent No.: US 12,757,342 B2
(45) Date of Patent: Oct. 6, 2026

(54) DISPLAY DEVICE AND VEHICLE HAVING THE SAME

(71) Applicant: HYUNDAI MOBIS CO., LTD., Seoul (KR)

(72) Inventors: Byung Soo Kim, Hanam-si (KR); Jun Seong Seo, Yongin-si (KR); Joung Hoon Lee, Yongin-si (KR); Dong Young Lee, Yongin-si (KR); In Whan Choi, Guri-si (KR); Hae Ri Kang, Suwon-si (KR); Ho Won Song, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 124 days.

(21) Appl. No.: 18/606,599

(22) Filed: Mar. 15, 2024

(65) Prior Publication Data

US 2025/0081372 A1 Mar. 6, 2025

(30) Foreign Application Priority Data

Aug. 30, 2023 (KR) ........................ 10-2023-0114244

(51) Int. Cl.
*H05K 5/03* (2006.01)
*B60K 35/22* (2024.01)

(52) U.S. Cl.
CPC ............... *H05K 5/03* (2013.01); *B60K 35/22* (2024.01)

(58) Field of Classification Search
CPC ...... H05K 5/0017; H05K 5/0217; H05K 5/03; B60K 35/22
USPC ......................................... 361/807, 809, 810
See application file for complete search history.

(56) References Cited

U.S. PATENT DOCUMENTS

| | | | | |
|---|---|---|---|---|
| 2015/0002936 A1* | 1/2015 | Jun | G02F 1/133512 | 359/492.01 |
| 2016/0077652 A1* | 3/2016 | Yang | G06F 3/04886 | 345/174 |
| 2017/0034929 A1* | 2/2017 | Jeong | H05K 5/0026 | |
| 2017/0192289 A1* | 7/2017 | Won | G02F 1/133514 | |
| 2018/0024396 A1* | 1/2018 | Kang | G06F 1/1601 | 361/688 |
| 2018/0153038 A1* | 5/2018 | Kim | H05K 7/20436 | |

FOREIGN PATENT DOCUMENTS

WO WO-2014091978 A1 * 6/2014 ............. H04N 5/645

* cited by examiner

*Primary Examiner* — Hung S. Bui
(74) *Attorney, Agent, or Firm* — Morgan Lewis & Bockius LLP

(57) ABSTRACT

Disclosed is a display device mounted on a vehicle, the display device including a display module, a back cover surrounding side and rear surfaces of the display module, the back cover having a cover bracket formed by protruding from a lower side of a rear surface thereof, a printed circuit board connected to the display module and having one surface covered by the cover bracket, and a bottom cover covering the other surface of the printed circuit board and coupled to the cover bracket, wherein the printed circuit board is positioned vertical to the rear surface of the back cover, whereby watertight performance of the display device may be improved by covering a printed circuit board through a cover bracket formed to protrude from a back cover and a bottom cover coupled to the cover bracket.

14 Claims, 5 Drawing Sheets

DISPLAY DEVICE AND VEHICLE HAVING THE SAME

This application claims the benefit of Korean Patent Application No. 10-2023-0114244, filed on Aug. 30, 2023, which is hereby incorporated by reference as if fully set forth herein.

BACKGROUND OF THE DISCLOSURE

Field of the Disclosure

The present disclosure relates to a display device and vehicle having the same, which improves the watertight performance of the display device through a shape of a back cover covering a printed circuit board in the display device mounted on the vehicle and secures rigidity while reducing a thickness of the display device through a cover member covering a backlight unit.

Discussion of the Related Art

A center fascia display of a vehicle may display various visual information about the vehicle. Such a display device may also be installed in a dashboard of a vehicle disposed in front of a driver's seat and a front passenger seat, and provides various convenience information such as navigation, vehicle management and operation, Internet, and entertainment.

A display device processes a signal via a Printed Circuit Board (PCB) located on a rear surface of a display panel to display an image.

Generally, the printed circuit board is placed parallel to the rear surface of the display panel. In this case, there is a risk that the printed circuit board is damaged by moisture or water that may flow into the gap of the display device.

For example, when a vehicle occupant operates the display device while drinking a beverage, the beverage may flow into the gap of the display device, causing damage to the printed circuit board.

Therefore, there is a need for a means to improve the watertight performance of the display device so that the printed circuit board can be protected from moisture or water that may flow into the gap of the display device.

In addition, recently, a size of a display device mounted on a vehicle has been increasing, and accordingly, a means to reduce the thickness of the display device and at the same time secure rigidity is needed.

Moreover, an electronic device emits electromagnetic waves between electronic components mounted on the printed circuit board, causing ElectroMagnetic Interference (EMI). The EMI causes malfunction of the electronic device or has a negative impact on a human body. In particular, as an operating frequency of the electronic device increases to be within a range of tens of MHz to several GHz, the EMI problems are becoming more serious.

Therefore, even in the case of a display device mounted on a vehicle, a means capable of solving the aforementioned EMI noise problem is needed.

SUMMARY OF THE DISCLOSURE

Accordingly, embodiments of the present disclosure are directed to a display device and vehicle having the same that substantially obviate one or more problems due to limitations and disadvantages of the related art.

One object of the present application is to provide a display device and vehicle having the same that may improve the watertight performance of the display device in a manner of covering a printed circuit board through a cover bracket protruding from a back cover and a bottom cover coupled to cover bracket.

Another object of the present application is to provide a display device and vehicle having the same that may secure rigidity while reducing a thickness of the display device in a manner of coupling a cover member covering a backlight unit with a glass and disposing a fixing member fixing a display panel inside the cover member.

Technical tasks obtainable from the present disclosure are non-limited by the above-mentioned technical tasks. And, other unmentioned technical tasks can be clearly understood from the following description by those having ordinary skill in the technical field to which the present disclosure pertains.

To achieve these objects and other advantages and in accordance with the purpose of the disclosure, as embodied and broadly described herein, provided is a display device mounted on a vehicle including a display module, a back cover surrounding side and rear surfaces of the display module, the back cover having a cover bracket formed by protruding from a lower side of a rear surface thereof, a printed circuit board connected to the display module and having one surface covered by the cover bracket, and a bottom cover covering the other surface of the printed circuit board and coupled to the cover bracket, wherein the printed circuit board is positioned vertical to the rear surface of the back cover.

The display module may include a display panel displaying an image, a glass covering a front surface of the display panel, a backlight unit positioned on a rear surface of the display panel, and a cover member coupled to a rear surface of the glass and covering the backlight unit.

Upper and lower portions of the cover member may be bent toward the rear surface of the glass, and the display module may include a fixing member fixing the display panel and located inside the cover member.

Upper and lower surfaces of the cover member may coupled to the rear surface of the glass through an adhesive member.

The cover member may include a partition formed by protruding from a lower side of the front surface thereof.

A light source of the backlight unit may be positioned on an upper surface of the partition.

The back cover may include a high-strength composite material.

In another aspect of the present disclosure, as embodied and broadly described herein, provided is a vehicle including a vehicle body, a mounting part located at the vehicle body, and a display device mounted on the mounting part, the display device including a display module, a back cover surrounding side and rear surfaces of the display module, the back cover having a cover bracket formed by protruding from a lower side of a rear surface thereof, a printed circuit board connected to the display module and having one surface covered by the cover bracket, and a bottom cover covering the other surface of the printed circuit board and coupled to the cover bracket, wherein the printed circuit board is positioned vertical to the rear surface of the back cover.

The display module may include a display panel displaying an image, a glass covering a front surface of the display panel, a backlight unit positioned on a rear surface of the display panel, and a cover member coupled to a rear surface of the glass and covering the backlight unit.

Upper and lower portions of the cover member may be bent toward the rear surface of the glass and the display module may include a fixing member fixing the display panel and located inside the cover member.

Accordingly, the present disclosure provides various effects and/or advantages.

First, a display device and vehicle having the same according to the present disclosure may improve the water-tight performance of the display device in a manner of covering a printed circuit board through a cover bracket protruding from a back cover and a bottom cover coupled to cover bracket.

Second, a display device and vehicle having the same may secure rigidity while reducing a thickness of the display device in a manner of coupling a cover member covering a backlight unit with a glass and disposing a fixing member fixing a display panel inside the cover member.

Effects obtainable from the present disclosure may be non-limited by the above-mentioned effect. And, other unmentioned effects can be clearly understood from the following description by those having ordinary skill in the technical field to which the present disclosure pertains. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. The above and other aspects, features, and advantages of the present disclosure will become more apparent upon consideration of the following description of preferred embodiments, taken in conjunction with the accompanying drawing figures. In the drawings.

DETAILED DESCRIPTION OF THE DISCLOSURE

Description will now be given in detail according to exemplary embodiments disclosed herein, with reference to the accompanying drawings. The same or equivalent components may be provided with the same reference numbers, and description thereof will not be repeated. As used herein, the suffixes "module" and "part" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification. As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, it will be understood that when an element is referred to as being "directly connected with" another element, there are no intervening elements present.

A singular representation may include a plural representation unless it represents a definitely different meaning from the context.

The terms such as "include" or "have" used herein are intended to indicate that features, numbers, steps, operations, elements, components, or combinations thereof used in the following description exist and it should be thus understood that the possibility of existence or addition of one or more different features, numbers, steps, operations, elements, components, or combinations thereof is not excluded.

Figure 1:
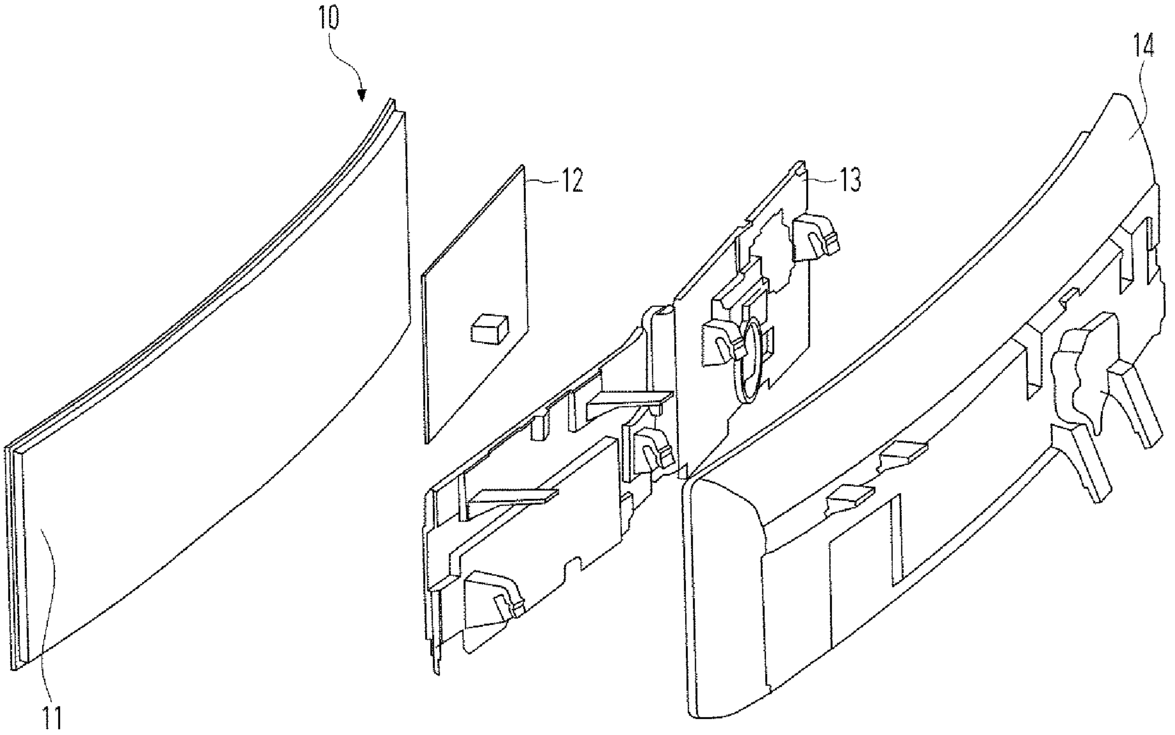
FIG. 1 is an exploded perspective diagram showing a display device generally mounted on a vehicle.

FIG. 1 is an exploded perspective diagram showing a display device 10 generally mounted on a vehicle.

As shown in FIG. 1, a general display device 10 includes a display module 11, a printed circuit board 12 connected to the display module 11, a bracket 13 covering the display module 11 and the printed circuit board 12, and a back cover 14.

In the case of the general display device 10, the printed circuit board 12 is disposed parallel to a rear surface of the display module 11. In addition, the bracket 13 covering the display module 11 and the printed circuit board 12 is generally made of aluminum as a configuration for shielding and heat dissipation, and the back cover 14 is generally made of plastic.

Yet, when the printed circuit board 12 is disposed in parallel with the rear surface of the display module 11 as described above, there is a problem that the printed circuit board 12 may be damaged by moisture that may flow into a gap of the display device 10. Therefore, it is necessary to improve watertight performance by protecting the printed circuit board 12 from moisture that may flow into the gap of the display device 10.

In addition, as described above, in order to reduce a thickness of the display device 10, as the display device 10 becomes larger, it is necessary to omit the configuration. If the bracket 13 covering the display module 11 and the printed circuit board 12 can be omitted, the thickness of the display device 10 can be reduced.

Figure 2:
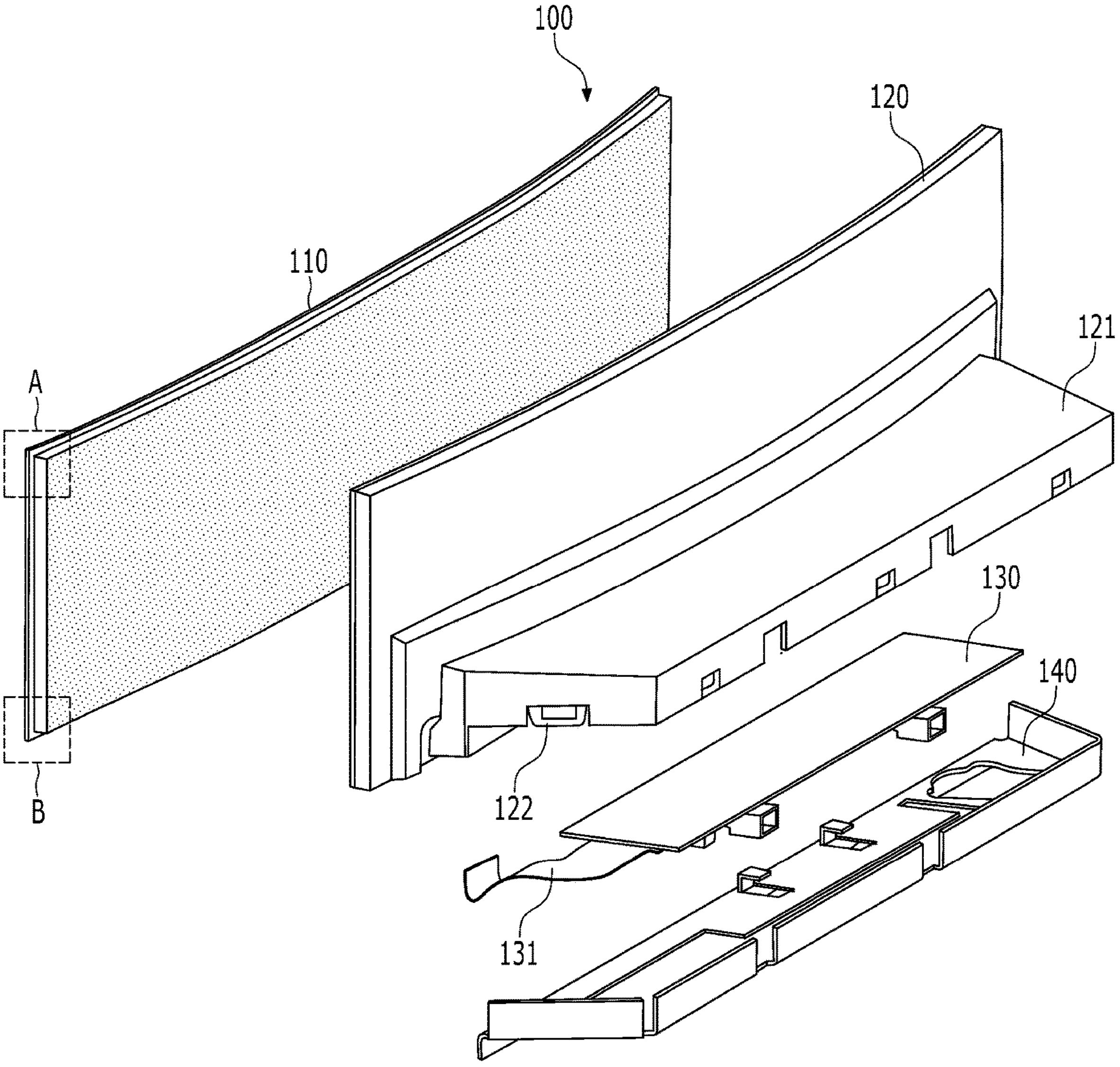
FIG. 2 is an exploded perspective diagram showing a display device according to one embodiment of the present disclosure.
Figure 3:
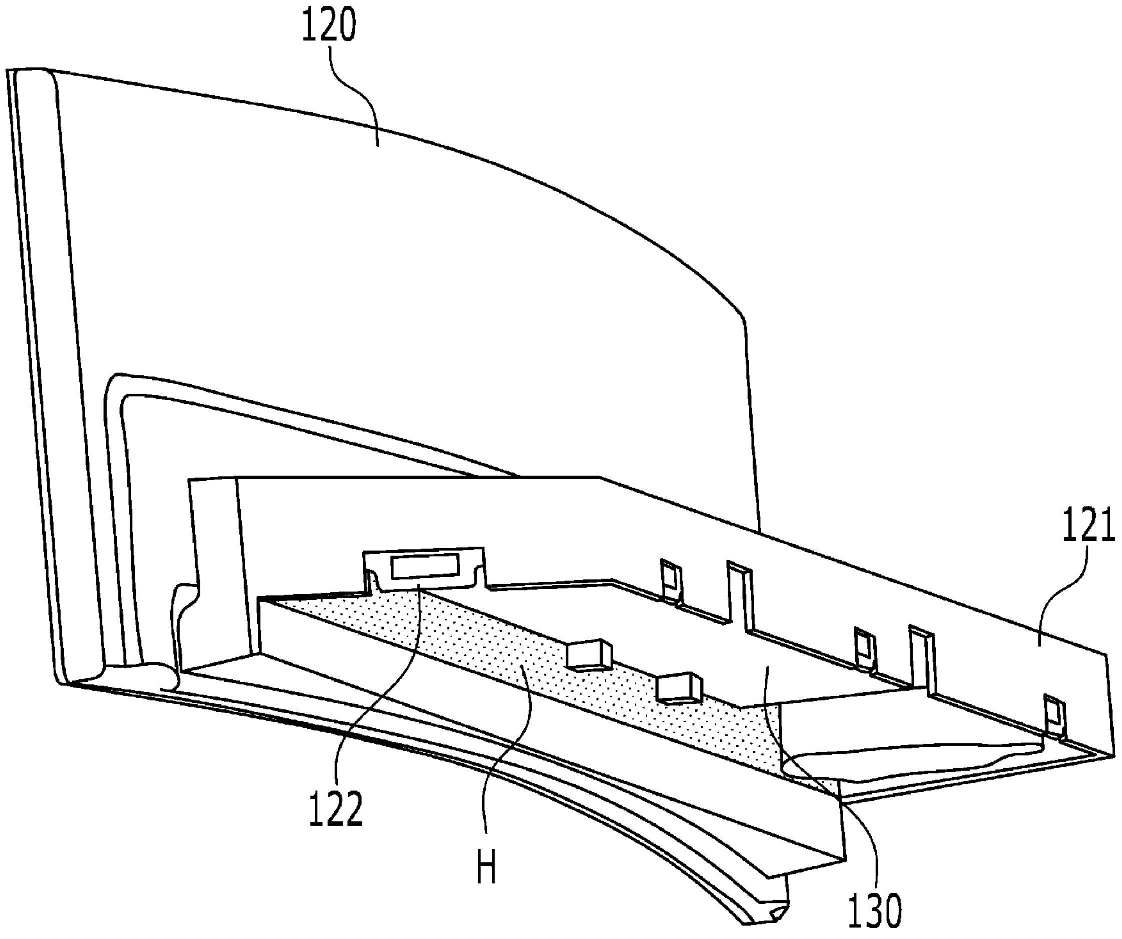
FIG. 3 is a diagram showing a shape in which a printed circuit board is covered with a cover bracket of a back cover in a display device according to one embodiment of the present disclosure.

FIG. 2 is an exploded perspective diagram showing a display device 100 according to one embodiment of the present disclosure. FIG. 3 is a diagram showing a shape in which a printed circuit board 130 is covered with a cover bracket 121 of a back cover 120 in the display device 100 according to one embodiment of the present disclosure. FIG.

Figure 5:
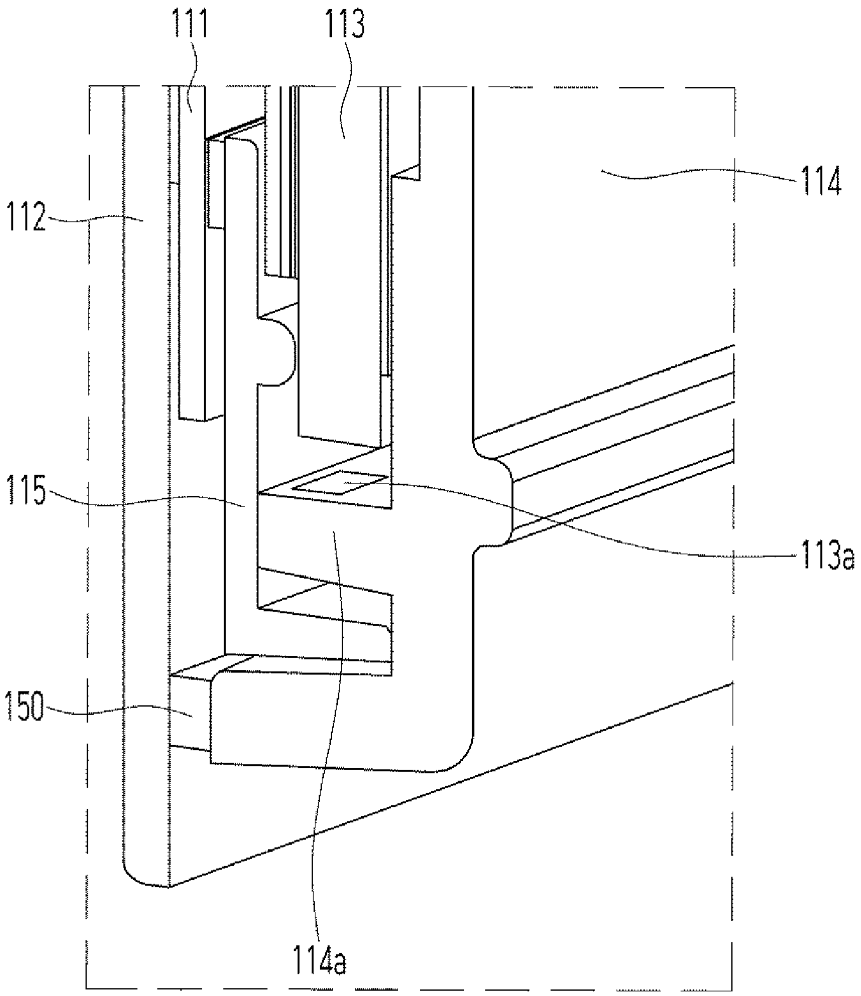
FIG. 5 is an enlarged diagram showing an area B of FIG. 1.

4 is an enlarged diagram showing an area A of FIG. 1, and FIG. 5 is an enlarged diagram showing an area B of FIG. 1.

A display device 100 according to one embodiment of the present disclosure may include a display module 110, a back cover 120, a printed circuit board 130, and a bottom cover 140. The back cover 120 may cover the display module 110 while surrounding side and rear surfaces of the display module 110. In addition, a cover bracket 121 may be included in a manner of being formed by protruding from a lower side of a rear surface of the back cover 120. In addition, a bottom cover 140 may be coupled to the cover bracket 121, and the bottom cover 140 may be fixed and coupled to the cover bracket 121 through a coupling slot 122 formed in a side surface of the cover bracket 121. In addition, the cover bracket 121 and the bottom cover 140 may be embedded in a mount part of a vehicle. As shown in FIG. 2 and FIG. 3, the back cover 120 may have an "L" shape by the cover bracket 121 protruding from the rear surface to be formed at a right angle. In addition, one surface of the printed circuit board 130 may be covered by the cover bracket 121, and the bottom cover 140 may be coupled to the cover bracket 121 to cover the other surface of the printed circuit board 130.

That is, the display device 100 according to one embodiment of the present disclosure may cover the printed circuit board 130 with the cover bracket 121 and the bottom cover 140 of the back cover 120, and the printed circuit board 130 may be located perpendicular to the rear surface of the back cover 120.

Through this, the display device 100 according to one embodiment of the present disclosure may improve the watertight performance of the display device 100 by protecting the printed circuit board 130 from moisture that may flow into the gap of the display device 100.

In addition, in the display device 100 according to one embodiment of the present disclosure, the back cover 120 may include a high-strength composite material having conductivity. This is to reduce EMI noise through the back cover 120 including a conductive material because electromagnetic waves are emitted between electronic components mounted on the printed circuit board 130 as described above and Electromagnetic Interference (EMI) may be caused.

In addition, the display device 100 according to one embodiment of the present disclosure may omit the bracket 13 shown in FIG. 1 to reduce the thickness of the display device 100 as described above, and the back cover 120 may include a high-strength composite material with more rigidity than a plastic material.

Moreover, through this, the display device 100 may be stably mounted on the vehicle, and may be advantageous for damage caused by external force that may be applied to the display device 100. Therefore, the rigidity of the display device 100 may be secured through the back cover 120 including the high-strength composite material.

In addition, in the display device 100 according to one embodiment of the present disclosure, the bottom cover 140 is coupled to the cover bracket 121 and covers the other surface of the printed circuit board 130. And, the bottom cover 140 may be formed of a metal material such as aluminum for shielding and heat dissipation.

In addition, the printed circuit board 130 may be connected to the display module 110 in the display device 100 according to one embodiment of the present disclosure, and in this case, a connection cable 131 of the printed circuit board 130 may pass through a hole (H) provided in the back cover 120 to be connected to the display module 110.

Figure 4:
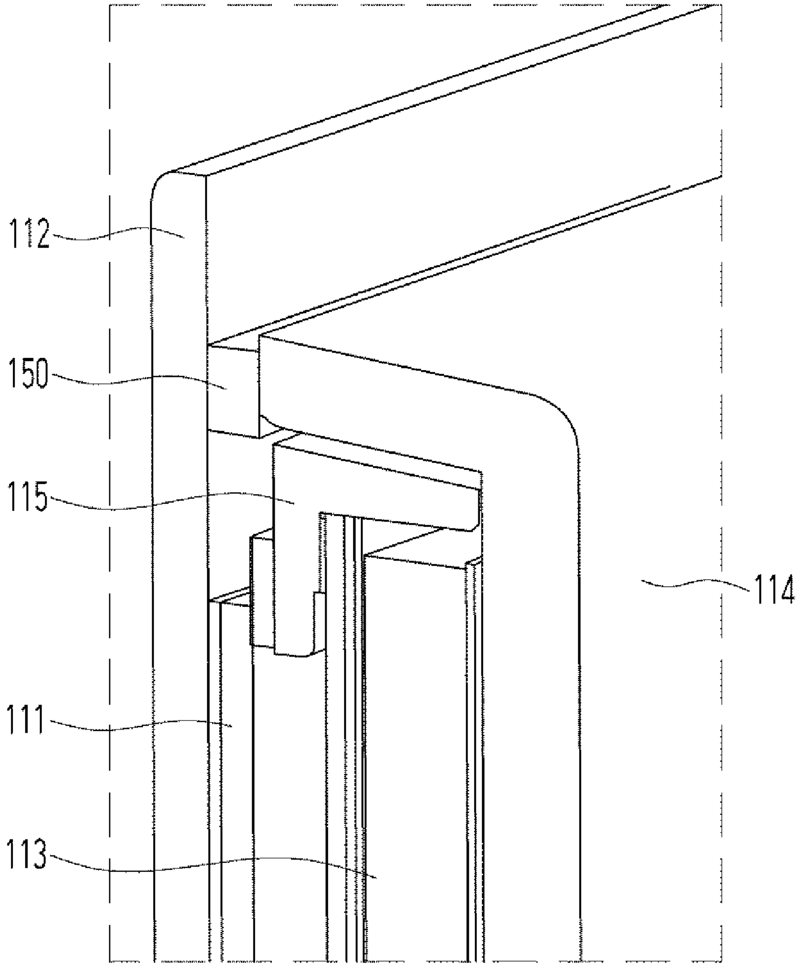
FIG. 4 is an enlarged diagram showing an area A of FIG. 1.

Referring to FIG. 4 and FIG. 5, in the display device 100 according to one embodiment of the present disclosure, the display module 110 may include a display panel 111 for displaying an image, a glass 112 for covering a front surface of the display panel 111, a backlight unit 113 located on a rear surface of the display panel 111, and a cover member 114. Here, the backlight unit 113 may be a device for providing a light source to the display panel 111 by forming a uniform surface light source.

The cover member 114 may be coupled to a rear surface of the glass 112 and may cover the backlight unit 113. In addition, upper and lower portions of the cover member 114 may be bent toward the rear surface of the glass 112. Here, the display module 110 may include a fixing member 115 positioned inside the cover member 114 to fix the display panel 111 thereto.

That is, since the upper and lower portions of the cover member 114 may be bent toward the rear surface of the glass 112 and the cover member 114 may be located inside the cover member 114, upper and lower surfaces of the cover member 114 may be directly coupled to the rear surface of the glass 112 through an adhesive member 150.

Accordingly, the display device 100 according to one embodiment of the present disclosure may reduce the thickness of the display device 100 through a structure in which the cover member 114 covering the backlight unit 113 is directly coupled to the rear surface of the glass 112 and the fixing member 115 fixing the display panel 111 is located inside the cover member 114.

Additionally, in the display device 100 according to one embodiment of the present disclosure, the cover member 114 may include a high-strength composite material having superior rigidity than a plastic material, thereby securing the rigidity of the display device 100.

In addition, as shown in FIG. 5, the cover member 114 may include a partition **114*a* protruding from a lower side of a front surface, and a light source 113*a* of the backlight unit 113 may be positioned on an upper surface of the partition 114*a*. Here, according to one embodiment of the present disclosure, the light source 113*a* may include a Light Emitting Diode (LED). That is, a plurality of LEDs may be arranged in a line on the upper surface of the partition 114*a* to directly apply light toward a front surface of the display panel 111**.

In summary, a display device and vehicle having the same according to the present disclosure may improve watertight performance of the display device by covering a printed circuit board through a cover bracket formed to protrude from a back cover and a bottom cover coupled to the cover bracket. In addition, a cover member covering a backlight unit is coupled to a glass and a fixing member fixing the display panel is positioned inside the cover member, thereby securing rigidity while reducing a thickness of the display device.

The above detailed description is to be construed in all aspects as illustrative and not restrictive. The scope of the present disclosure should be determined by reasonable interpretation of the appended claims and all changes coming within the equivalency range of the present disclosure are intended to be embraced in the scope of the present disclosure.

What is claimed is:

1. A display device mounted on a vehicle, the display device comprising:

a display module including:

a display panel configured to display an image, a backlight unit positioned on a rear surface of the display panel and a cover member coupled to a rear surface of a glass of the display panel and covering the backlight unit;

a back cover surrounding side and rear surfaces of the display module, the back cover having a cover bracket protruding from a lower side of a rear surface of the back cover;

a printed circuit board connected to the display module and having one surface covered by the cover bracket; and a bottom cover covering the other surface of the printed circuit board and coupled to the cover bracket, wherein the printed circuit board is positioned perpendicular to the rear surface of the back cover, wherein the printed circuit board includes a connection cable that passes through a hole provided in the back cover, wherein the cover member comprises a partition protruding from a lower side of a front surface of the cover member, and a light source of the backlight unit is positioned on an upper surface of the partition and under the backlight unit.

2. The display device of claim 1, wherein the glass covers a front surface of the display panel.

3. The display device of claim 2, wherein an upper portion and a lower portion of the cover member are bent toward the rear surface of the glass, and the display module comprises a fixing member fixing the display panel and located inside the cover member.

4. The display device of claim 3, wherein the upper portion and the lower portion of the cover member are coupled to the rear surface of the glass through an adhesive member.

5. The display device of claim 3, wherein the fixing member includes a portion protruding from a lower side of the fixing member.

6. The display device of claim 5, wherein the portion of the fixing member is located between the partition and the lower portion of the cover member.

7. The display device of claim 1, wherein the back cover includes a high-strength composite material having greater rigidity than a plastic material.

8. A vehicle, comprising:

a vehicle body;

a mounting part located at the vehicle body; and a display device mounted on the mounting part, the display device comprising:

a display module including: a display panel configured to display an image, a backlight unit positioned on a rear surface of the display panel and a cover member coupled to a rear surface of a glass of the display panel and covering the backlight unit;

a back cover surrounding side and rear surfaces of the display module, the back cover having a cover bracket protruding from a lower side of a rear surface of the back cover;

a printed circuit board connected to the display module and having one surface covered by the cover bracket; and a bottom cover covering the other surface of the printed circuit board and coupled to the cover bracket, wherein the printed circuit board is positioned perpendicular to the rear surface of the back cover, wherein the printed circuit board includes a connection cable that passes through a hole provided in the back cover, wherein the cover member comprises a partition protruding from a lower side of a front surface of the cover member, and a light source of the backlight unit is positioned on an upper surface of the partition and under the backlight unit.

9. The vehicle of claim 8, wherein the glass covers a front surface of the display panel.

10. The vehicle of claim 9, wherein an upper portion and a lower portion of the cover member are bent toward the rear surface of the glass, and the display module comprises a fixing member fixing the display panel and located inside the cover member.

11. The vehicle of claim 10, wherein the upper portion and the lower portion of the cover member are coupled to the rear surface of the glass through an adhesive member.

12. The vehicle of claim 10, wherein the fixing member includes a portion protruding from a lower side of the fixing member.

13. The vehicle of claim 12, wherein the portion of the fixing member is located between the partition and the lower portion of the cover member.

14. The vehicle of claim 8, wherein the back cover includes a high-strength composite material having greater rigidity than a plastic material.

* * * * *